United States Patent [19]
Pribat et al.

[11] Patent Number: 5,262,348
[45] Date of Patent: Nov. 16, 1993

[54] METHOD FOR THE GROWING OF HETEROEPITAXIAL LAYERS WITHIN A CONFINEMENT SPACE

[75] Inventors: Didier Pribat, Sevres; Pierre Legagneux, Le Mesnil St Denis; Christian Collet, Limours; Valérie Provendier, Antony, all of France

[73] Assignee: Thomson-CSF, Puteaux, France

[21] Appl. No.: 769,243

[22] Filed: Oct. 1, 1991

[30] Foreign Application Priority Data

Oct. 9, 1990 [FR] France .................. 90 12443

[51] Int. Cl.⁵ .......................................... H01L 21/20
[52] U.S. Cl. .......................................... 437/89; 437/84;
437/126; 437/243; 437/973; 156/611; 156/644;
148/DIG. 26
[58] Field of Search .................. 437/89, 90, 78, 84,
437/126, 133, 973; 156/611, 610, 613;
148/DIG. 26

[56] References Cited

U.S. PATENT DOCUMENTS

| | | | |
|---|---|---|---|
| 4,371,421 | 2/1983 | Fan et al. | 437/89 |
| 4,751,193 | 6/1988 | Myrick | 437/84 |
| 4,948,456 | 8/1990 | Schubert . | |
| 4,952,526 | 8/1990 | Pribat et al. | 437/90 |

FOREIGN PATENT DOCUMENTS

| | | |
|---|---|---|
| 0336830 | 10/1989 | European Pat. Off. . |
| 2629637 | 10/1989 | France . |
| 65-51622 | 3/1988 | Japan .................. 437/90 |

Primary Examiner—Olik Chaudhuri
Assistant Examiner—H. Jey Tsai
Attorney, Agent, or Firm—Oblon, Spivak, McClelland, Maier & Neustadt

[57] ABSTRACT

Disclosed is a method for the growing of heteroepitaxial layers of monocrystalline semiconductor materials. To this end, on a substrate made of a material of a first type, there is made a seed of a second type of material. This seed is between a face of the substrate and a confinement layer which defines a confinement space with the face of the substrate. A vapor phase epitaxy of a material of the second type is then effected in the confinement space. This material of the second type grows from the seed in the confinement space. The method can be applied to the manufacture of heterogeneous semiconductor structures and to the three-dimensional integration of semiconductor components.

9 Claims, 6 Drawing Sheets

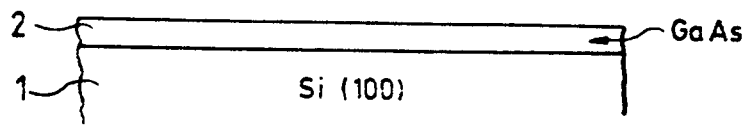
FIG. 3a
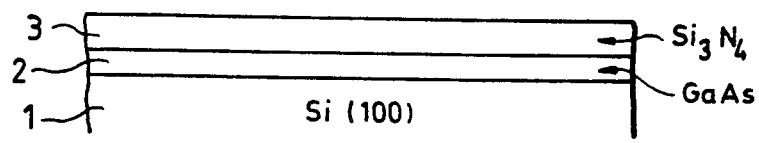
FIG. 3b
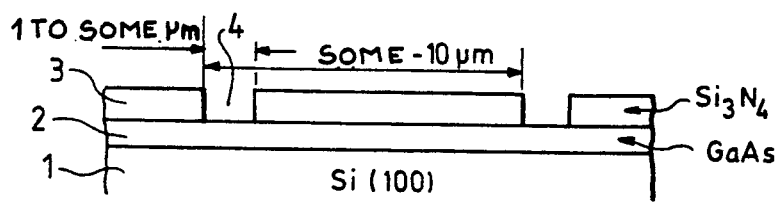
FIG. 3c
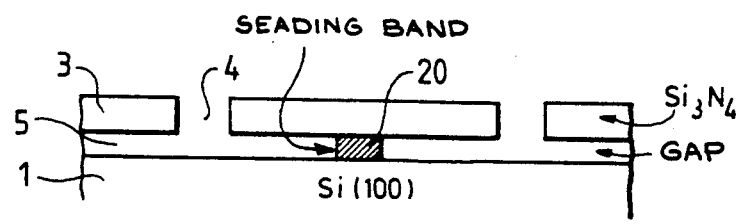
FIG. 3d
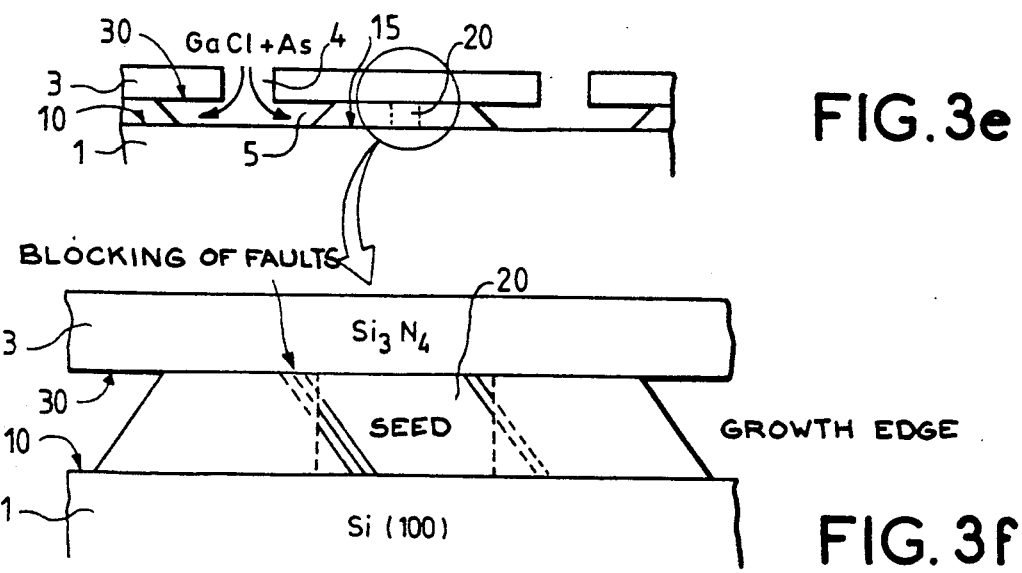
FIG. 3e
FIG. 3f

METHOD FOR THE GROWING OF HETEROEPITAXIAL LAYERS WITHIN A CONFINEMENT SPACE

BACKGROUND OF THE INVENTION

The invention relates to a method for the making of heteroepitaxial layers, more precisely, a method for the making of at least one thin layer of a semiconductor material on a semiconductor substrate of another type.

The invention relates to the field of "thin layers" and, particularly, to the field of monocrystalline thin layers epitaxially grown on a substrate of a different nature.

The invention will be preferably applied to the growing of GaAs layers on Si, and it enables the removal, by blocking, of the dislocations generated at the crystal/substrate interface.

During the heteroepitaxial growth of GaAs on Si, dislocations are generated at the crystal/substrate interface and spread in the thin layer during the deposition. Very broadly speaking, the presence of these dislocations is due both to the difference between the lattice parameters of Si (0.54 nm) and GaAs (0.56 nm) and to the difference between their coefficients of thermal expansion (2.3 $10^{-6}$° C. for Si against 5.6 $10^{-6}$° C.$^{-1}$ for GaAs).

These dislocations once nucleated are practically impossible to eliminate during a normal growth of the MBE (Molecular Beam Epitaxy) or MOCVD (Metal Organic Chemical Vapor Deposition) type, thus considerably limiting the application of the heteroepitaxy of GaAs on Si.

For, since the dislocations act as recombination centers, they drastically reduce the lifetime of the minority carriers The result of this is that it is practically impossible to make bipolar components, such as lasers and photodiodes for example, in the heteroepitaxially grown layers of GaAs.

A method of blocking dislocations has been developed (see the French patent application No. 88 044 38 filed on Apr. 5, 1988). This method can be used to obtain practically fault-free dislocations. The principle of this method (known as the forced growth method) is shown in FIG. 1. One of the drawbacks of this method is that it calls for the use of two dielectric levels and two masking levels to make the seeding bands, on the one hand, and the bands enabling the access of the gas of the forced epitaxy phase, on the other hand (see FIG. 1).

The present invention enables the above method to be considerably simplified by limiting it to a single dielectric layer and to a single masking level.

SUMMARY OF THE INVENTION

The invention therefore relates to a method for the manufacturing, by vapor phase growth, on a substrate made of a semiconductor material of a first type, of a monocrystalline thin layer of a semiconductor material of a second type, wherein the growth is initiated on at least one seed with a chemical composition identical to that of the semiconductor material of the second type, and is confined to a space defined by a face of the substrate itself and a confinement layer made of a material different from the semiconductor material of the second type, in such a way that there can be neither nucleation nor deposition of semiconductor material whether on this confinement layer or on said face of the substrate, the confinement space defining the thickness of the monocrystalline thin layer of semiconductor to be obtained.

BRIEF DESCRIPTION OF THE DRAWINGS

The different objects and features of the invention shall appear more clearly from the following description and from the appended drawings, of which:

FIGS. 3a to 3f show different steps of the manufacturing method according to the invention;

DETAILED DESCRIPTION OF THE INVENTION

Figure 1:
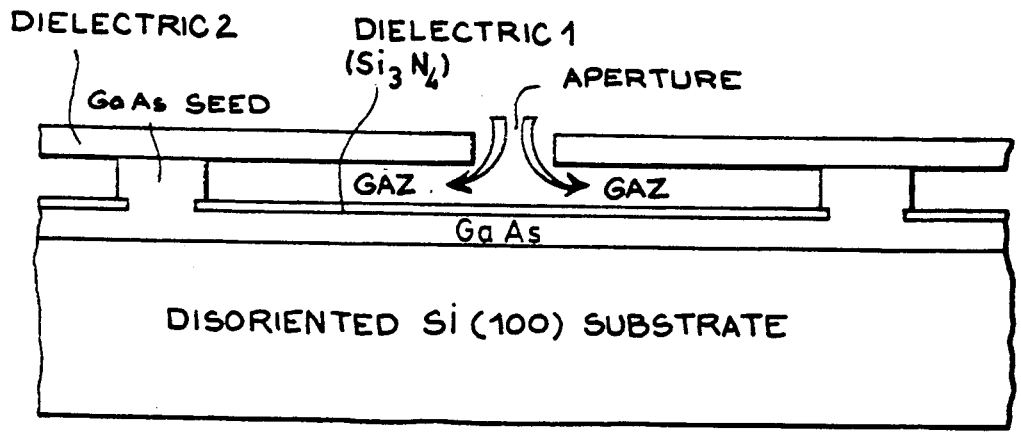
FIG. 1 illustrates the state of the art, already described here above.
Figure 2:
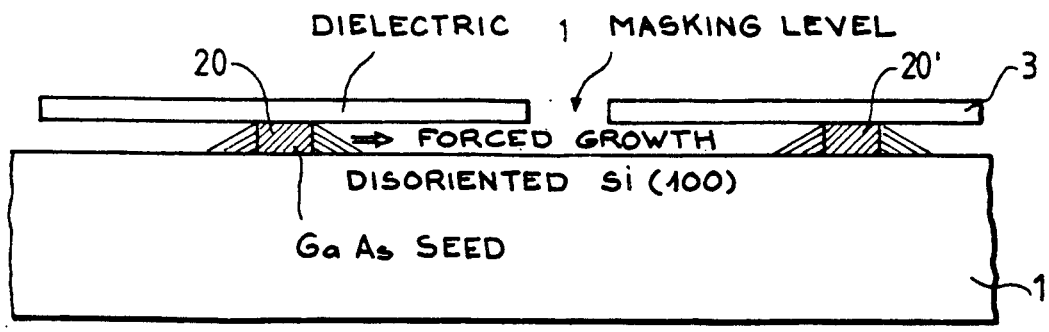
FIG. 2 shows a basic drawing of the manufacturing method according to the invention.

The principle of the method is shown in FIG. 2.

The feasibility of this method comes from the fact that it has been observed that GaAs deposited by a VPE method of the AsCl$_3$+Ga type (the so-called trichlorides method) does not nucleate on the free surfaces of silicon.

The invention shall be described with reference to the example of GaAs heteroepitaxially grown on Si, but its framework of application is much broader. For, to make it possible to apply the present method to the heteroepitaxy of a material A on a material B, it is enough to use a deposition method enabling the elimination (at least temporarily) of the nucleation of A on B or to provide for a material B on which there can be neither nucleation nor deposition of the material A.

The invention shall be understood more clearly from the following description.

On an initial substrate 1 made of silicon (100), a thin layer 2 of GaAs (typically with a thickness of 0.5 to 1 μm) is made (see FIG. 3a).

A wafer that is slightly disoriented towards the direction <100> does not necessarily have to be used, for the faults of the antiphase domain boundary type will also be blocked as shall be seen further below. This preliminary operation of heteroepitaxy can be done by MBE (Molecular Beam Epitaxy), MOCVD (Metal Organic Chemical Vapor Deposition), MOMBE (Metal Organic Molecular Beam Epitaxy), CBE (Chemical Beam Epitaxy) etc.

It is known (see for example the article by H. Kroemer in the book, "Heteroepitaxy on Silicon", edited by Fan and Poate, MRS Symposia Proceedings, No. 67, Pittsburgh Pa., 1986) that the layers of GaAs made by methods such as those referred to above contain, in the optimum cases, about $10^6$ dislocations per cm$^2$. They may also contain microtwins and antiphase domain boundaries depending on the conditions of growth. It is naturally impossible to manufacture lasers and photodiodes in the layers having a density of faults such as this.

On the GaAs layer 2, a uniform layer 3 of Si$_3$N$_4$ is made. This layer 3 has a typical thickness of the order of 0.3 to 0.9 μm (FIG. 3b). Si$_3$N$_4$ has been chosen in this exemplary embodiment, but it could also be any other material on which there could be neither nucleation nor deposition of the material (GaAs according to the example taken) which will be epitaxially grown in the following stages.

In this layer 3 of $Si_3N_4$, there is etched a series of apertures 4 taking the form of equidistant parallel bands.

The size of the apertures of these bands is of the order of one to several microns, and the repetition pitch is typically equal to some tens of microns, and may go up to several hundreds of $\mu m$ (see FIG. 3c).

These bands are oriented in such a way that, during the lateral growth which shall be carried out subsequently, there appears no single growth facet of the (111) type, which would have the effect of limiting the speed of lateral growth. Orientations of the $<110>$ and $<110>$ type will therefore be avoided for these bands. It has been observed that one group of orientations giving satisfactory results ranges from 15 to 30 degrees, for example 22.5°, on either side of the directions $<110>$ and $<110>$ mentioned above. This does not, however, restrict the scope of the invention and it may be necessary to use exact $<110>$ type orientations if (110) or (111) type facets are to be introduced.

The structure of FIG. 3c is submerged in a reagent for the chemical attacking of the layer 2. For example, a mixture of $H_2O_2$ and $H_2SO_4$ is appropriate to the selective elimination of a part of the thin layer 2 of the heteroepitaxially grown GaAs. However, the attacking of the layer 2 is stopped so as to preserve a central part 20 that is used to support the layer 3 of $Si_3N_4$ and will act as a seed during the operation of growth that follows. Thus, the structure of FIG. 3d is obtained.

The structure of FIG. 3d is introduced into a reactor, for example of the VPE (vapor phase epitaxy) type, using $AsCl_3$ and Ga as its sources. Under normal deposition conditions, i.e. when the Ga source is kept towards 850° C., the mole fraction of $AsCl_3$ is $10^{-3}$ and the substrate is kept in the region of 750° C., it is seen that there is nucleation and growth of GaAs on the central seed 20 but, on the contrary, neither nucleation nor growth is observed, whether on the exposed surfaces of the layer 3 of $Si_3N_4$ or on the Si substrate 1 (100).

A similar effect of selective growth may be obtained by using an MOCVD type reactor, with precursors that are no longer of the triethyl or trimethyl gallium type but incorporate chlorides, namely precursors such as diethylgallium chloride $(C_2H_5)_2 GaCl$ (see, for example, the document by Kuech et al, Proceedings of the 5th International Conference on MOVPE, Aachen, Germany Jun. 18-22, 1990).

Growth from the central seed 20 of GaAs is therefore done in the manner shown in FIG. 3e, between the surface of the substrate Si (100) and the lower surface of the layer 3 of $Si_3N_4$, without there being nucleation on Si and $Si_3N_4$.

A phenomenon of the blocking of all the faults that are not strictly parallel to the $GaAs/Si_3N_4$ interfaces (dislocations, microtwins and antiphase domain boundaries) is seen here. This blocking is done either on the lower face 30 of the layer 3 or on the surface of the Si (100) substrate 1, as is shown in FIG. 3f. Once the defects have been blocked, the growth continues normally on either side of the central seed 20, the crystal obtained being then one of excellent quality During a following step, the layer 3 is removed and GaAs semiconductor elements in thin layers are obtained on a silicon substrate.

In one variant of the technique, the structure shown in FIG. 3c is introduced directly into the epitaxy reactor. The attacking of the GaAs layer 2 through the apertures 4 made in the layer 3 of $Si_3N_4$ is then done in situ by hydrochloric acid HCl, either generated by the breakdown of $AsCl_3$ in the case of a trichloride reactor (it is then necessary to have an additional line of $AsCl_3$ that does not go through the Ga charge) or directly injected from a bottle in the case of an MOCVD reactor. The structure obtained after this in situ attack is identical to that of FIG. 3d. The subsequent steps remain unchanged.

It is observed, however, that the central region of the thin layer obtained remains defective which, depending on the applications envisaged, may raise problems. A description is given below of a way to overcome this drawback.

Figure 4A:
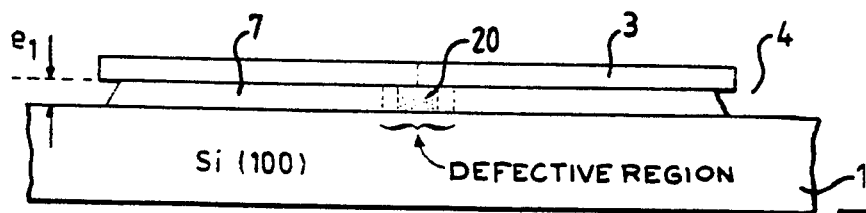
FIGS. 4a to 4f show different steps of an improvement of the method according to the invention.

The initial situation is shown schematically in FIG. 4a. It results from the previous method, and the epitaxial growth has been deliberately stopped in the confinement space 5 before the aperture 4 is reached, in order to avoid overflows.

Figure 4B:
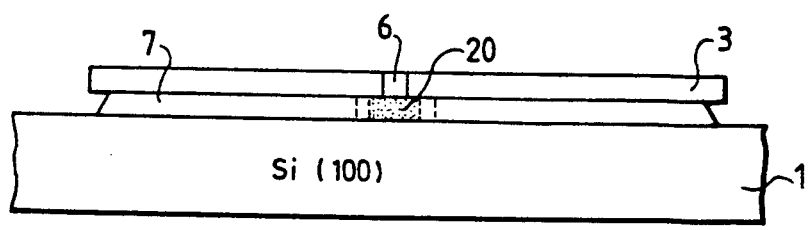
Figure 4C:
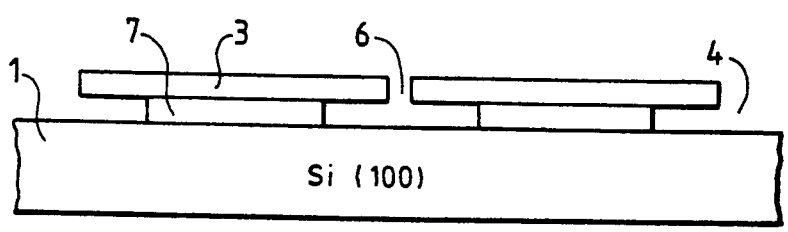

The method is continued by the opening, in the layer 3, of a window 6 parallel to the edges of the layer. This is done above the region of the seed 20 (FIG. 4b). The region of the seed and of defective GaAs is eliminated by chemical attack, for example by means of $H_2O_2$, $H_2SO_4$ (see FIG. 4c). This defective region can also be eliminated by an attack in situ in the epitaxy reactor, as described here above.

Figure 4D:
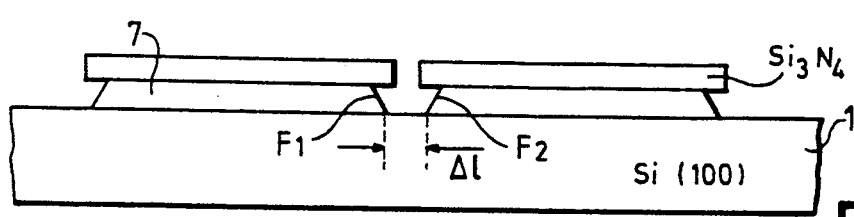

The selective epitaxial operation is repeated so as to fill a part of the gap left by the attack on the defective crystal (FIG. 4d). This operation of selective epitaxy is stopped when the two growth fronts $F_1$ and $F_2$ at the position where the defective crystal was located earlier are at a distance, from each other, of about $\Delta 1 = 1 \ \mu m$ (typical but non-restrictive value).

Figure 4E:
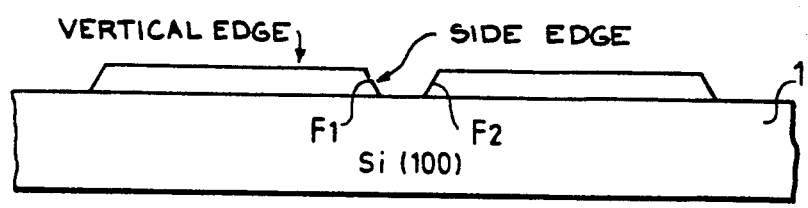
Figure 4F:
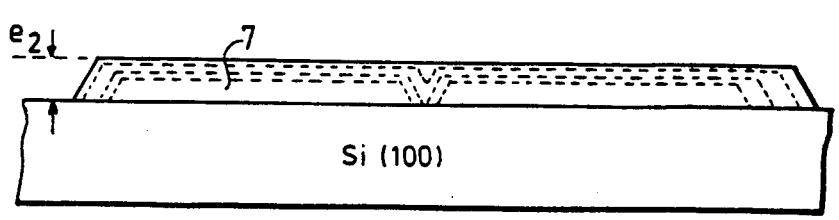

The layer 2 of $Si_3N_4$ is then eliminated (by HF attack for example) so as to obtain the structure of FIG. 4e.

If the different bands have been oriented by 22.5° from the direction $<110>$ as indicated here above, there is observed, for GaAs, a ratio of the order of 4 between the speed of growth of the lateral front and the speed of growth of the vertical front (here the plane (100) of the surface). Under these conditions, if the distance $\Delta 1$ between the fronts $F_1$ and $F_2$ (FIG. 4e) has been kept at a small value (typically 1 $\mu m$ as indicated here above), it is possible to make these two fronts meet by carrying out a low vertical growth (typically of the order of $\Delta \frac{1}{8} = 0.125 \ \mu m$, for an original spacing of the order of $1 = 1 \ \mu m$ between $F_1$ and $F_2$).

Thus, if it is desired to obtain a thin layer with a final thickness $e_2$, the starting thickness $e_1$ (see FIG. 4a) will be chosen so that $$e_1 = e_2 - \Delta \mathbf{i},$$

which dictates the additional condition $\Delta 1 < 8e_2$ during the lithography step of FIG. 4b leading to the etching of the layer 3 of $Si_2N_4$ above the defective region. Thus we obtain a layer 7 of a fault-free monocrystalline semiconductor material of a certain type (GaAs according to the example chosen) on a semiconductor material of another type (silicon according to the example chosen).

Figure 5:
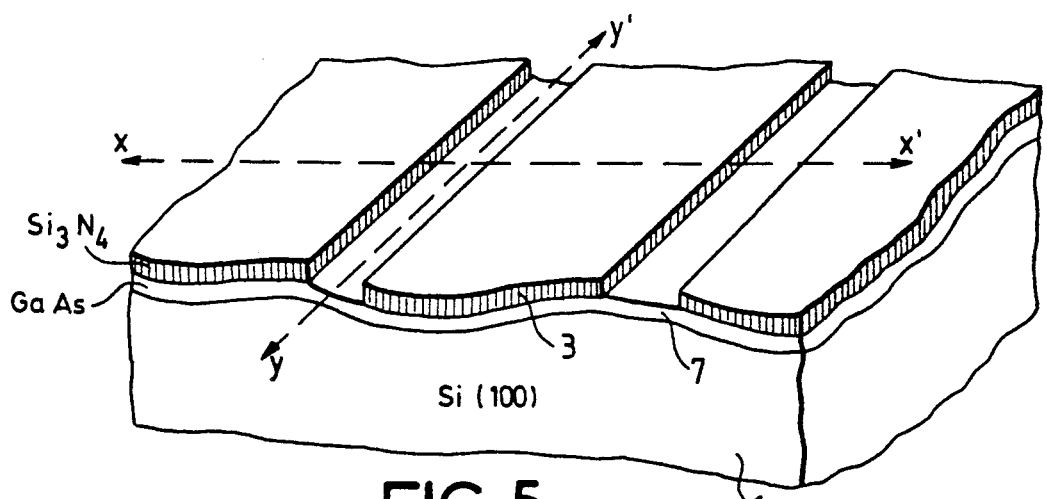
FIG. 5 shows an intermediate structure of the method of the invention.

The dimension of the bands in the direction parallel to the apertures such as 4 has been considered to be limited solely by the size of the substrate. The situation is summarized in FIG. 5 where, in the direction of the axis yy', the dimension of the bands resulting from the etching in the nitride layer 3 is not restricted (or is restricted only by the dimension of the substrate). In fact, it may be worthwhile to limit the GaAs seeding zones along the axis yy' in order to reduce the cooling stresses (due to the differences between the thermal expansion coefficients of GaAs and Si) in the seeding band 20, where the GaAs crystal has been nucleated on the substrate Si during the prior MBE or MOCVD operation. These stresses could lead, for example, to an undulation of the end of the GaAs films after forced growth.

A variant of the method of the invention therefore starts with the etching of insulation bands 8 in the layer 2 (GaAs) heteroepitaxially grown on the substrate.

Figure 6:
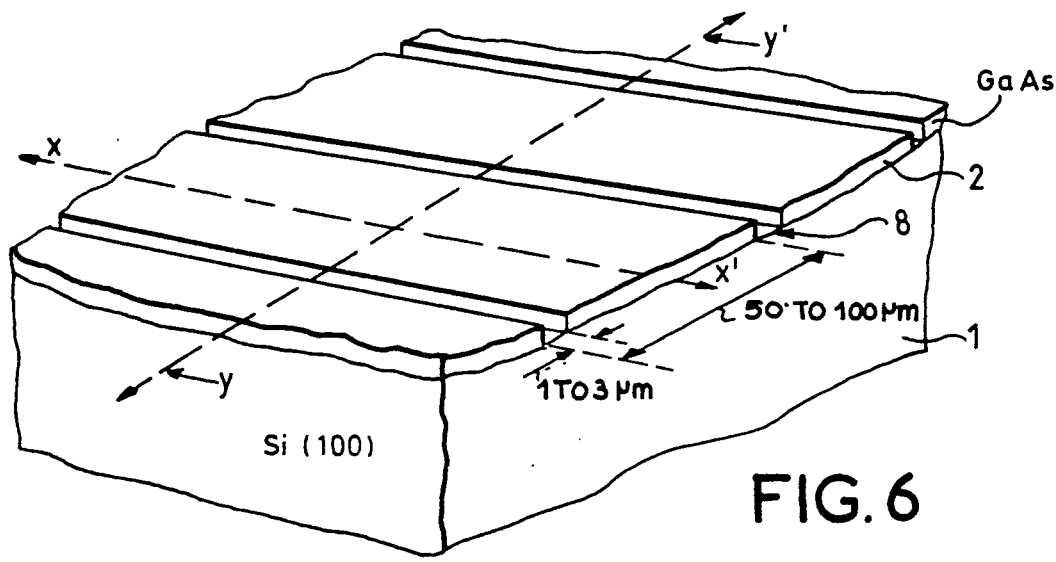
FIG. 6 shows an additional stage of a variant of the manufacturing method according to the invention.

The repetition pitch of these insulation bands 8 is typically 50 to 100 μm and the width of these bands is typically one to several microns (see FIG. 6). These bands are oriented as above, preferably at about 22.5° with respect to a direction <110> or (along xx' in FIG. 6).

Figure 7:
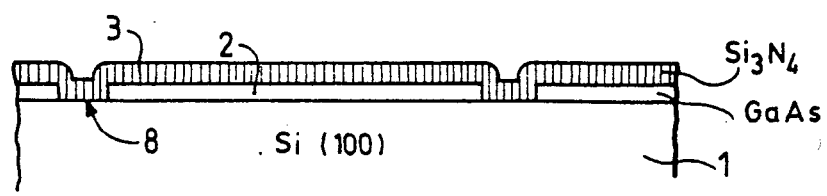
FIGS. 7 and 8 show stages of manufacture, resulting from the stage of FIG. 6.

The layer 3 of $Si_3N_4$ is then deposited on the previously etched surface. FIG. 7 shows a section along yy' after the deposition of this layer 3 of $Si_3N_4$.

The typical thickness of the layer 3 of $Si_3N_4$ is 0.5 to 1 μm.

Figure 8:
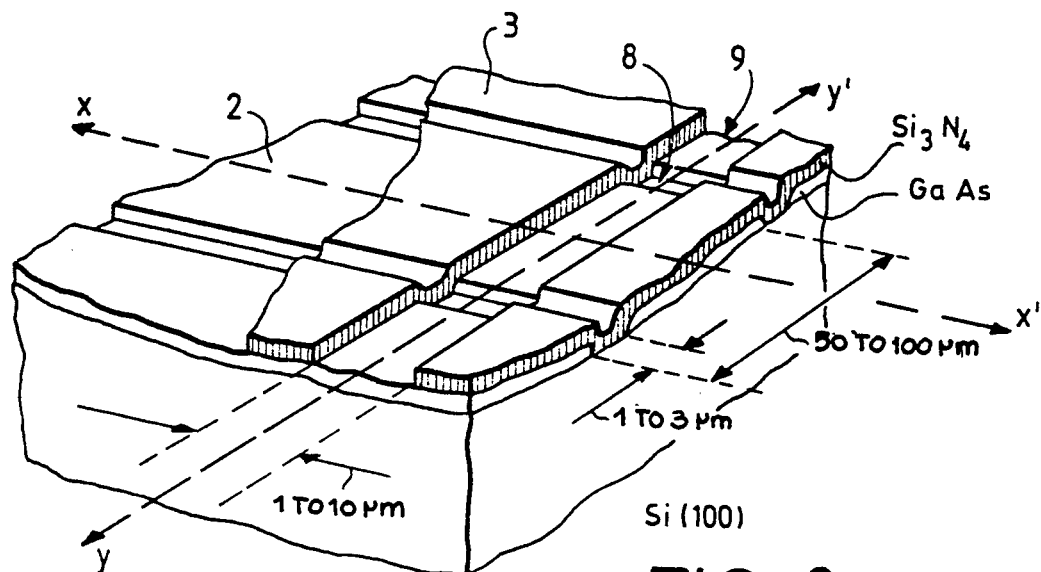

Just as in FIG. 3c, a second system of bands 9 is etched in the layer 3 of $Si_3N_4$. This second system of bands 9 may be preferably perpendicular to the first bands, i.e. perpendicular to the etchings 8 as shown in FIG. 8.

These bands typically have a width of 1 to 10 μm, and their repetition pitch ranges from some tens to some hundreds of microns.

The operations described with reference to FIGS. 3d and 3e are then repeated These FIGS. 3d and 3e may now be considered to be sections of FIG. 8 along the axis xx'.

Figure 9:
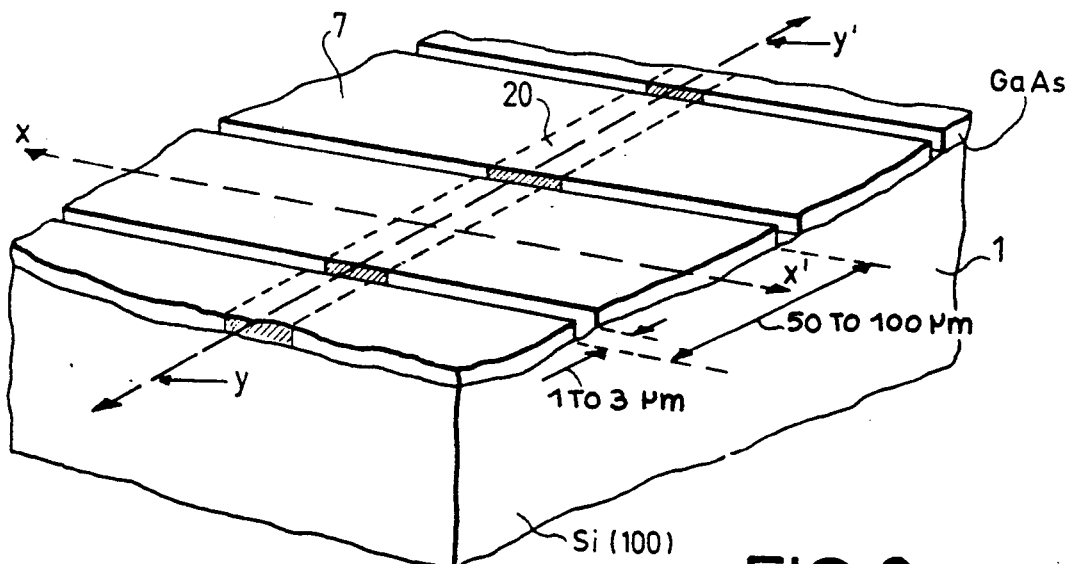
FIGS. 9 to 11 show stages for the manufacture of another variant of the method of the invention.

Thus, after forced growth and removal of the layer 3, we obtain GaAs blocks which are fault-free apart from the central seeding zone 20 (FIG. 9). The seed 20 and the band of faults can be eliminated according to the same type of operation as described in relation to FIG. 4.

Figure 10:
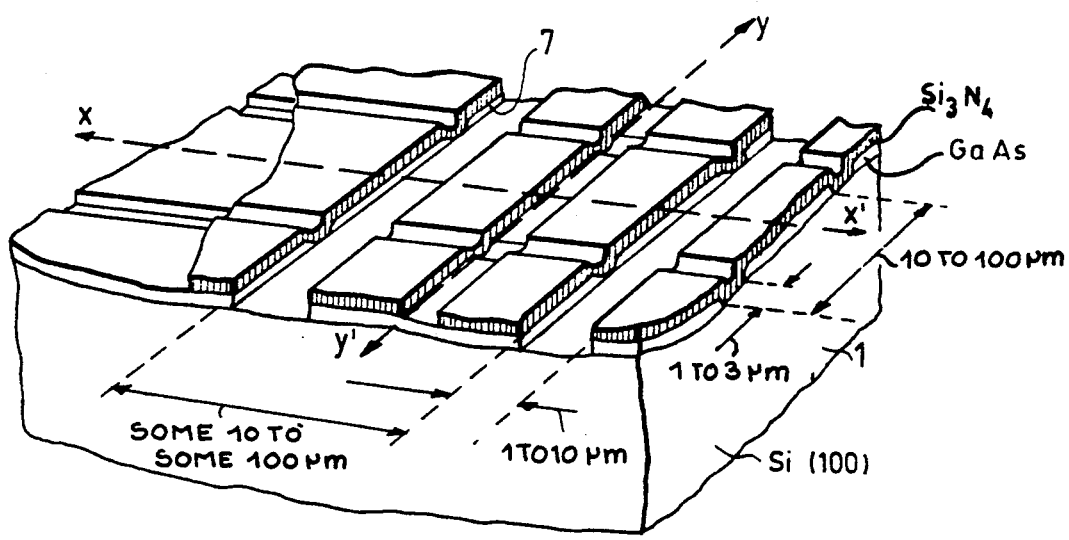
Figure 11:
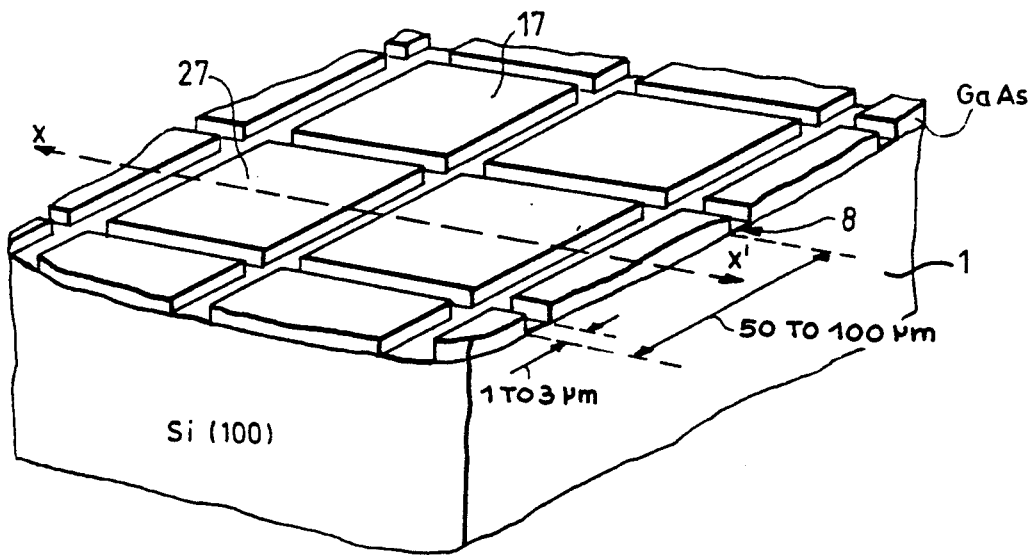

To this end, as shown in FIG. 10 before the removal of the layer 3, an etching is done of bands 6 in the layer 3, along a direction yy' so as to make an aperture above each seed 20. This operation corresponds to that of FIG. 4b. Then, as described in relation with FIG. 4c, a chemical attack is carried out on the seeds 20 and the defective semiconductor parts. Then an epitaxy of the same material as the bands 7 (GaAs) is made, the $Si_3N_4$ layer is removed and blocks of semiconductor material are obtained such as those shown in FIG. 11, made of fault-free semiconductor material.

It is then possible, if necessary, to effect a growth of semiconductor material (GaAs) on the blocks such as 17 and 27 (in a manner similar to that done with reference to FIG. 4f) so as to join two blocks 17 and 27.

According to the invention, it is also possible to modulate the composition of the epitaxially grown layer 15 or provide for a doping of the layer (doping of a same type, modulated or unmodulated, or else dopings of different types) as described in the French patent application No. 89 04257 filed on Mar. 31, 1989).

It is also possible to use the layer 15 obtained as a starting substrate for a following epitaxy and to continue the process in this manner to obtain a superimposition of epitaxially grown layers, or even a superimposition of components located in different planes.

The method of the invention may be applied to the making of monocrystalline thin layers of semiconductor materials on amorphous or polycrystalline insulators. It may enable the making of special structures (double-gate field-effect transistors, permeable base transistors, heterostructures and lateral superlattices etc.).

The method of the invention can thus be used to achieve growth with semiconductors of different natures and to obtain heteroepitaxial structures in which the different layers are nonetheless monocrystalline and have neither dislocations nor fault planes.

It is clear that the above description has been given purely as a non-restrictive example. Other variants may be envisaged without going beyond the scope of the invention. The numerical values have been given soley in order to illustrate the description. Besides, as already mentioned, the application of the invention to a semiconductor-based structure as indicated in the description has been provided solely by way of an example, and other materials could be used.

What is claimed is:

1. A method for the manufacturing, by vapor phase growth, on a substrate made of a semiconductor material of a first type, of a monocrystalline thin layer of a semiconductor material of a second type, which comprises initiating the vapor phase growth on at least one seed with a chemical composition identical to that of the semiconductor material of the second type, and confining the vapor phase growth to a confinement space defined by a face of the substrate itself and a confinement layer made of a material different from the semiconductor material of the second type, under conditions such that there can be neither nucleation nor deposition of semiconductor material whether on this confinement layer or on said face of the substrate, the confinement space defining the thickness of the monocrystalline thin layer of semiconductor to be obtained.

2. A method according to claim 1, wherein the seed is comprised in the confinement space.

3. A manufacturing method according to claim 1, comprising the following steps:
   a) a first step for the making, on the monocrystalline semiconductor substrate, of a first layer of a semiconductor material of the second type;
   b) a second step for the making, on the first layer, of the confinement layer as a second layer selected of material such that there can be neither nucleation nor deposition of a material of the second type on said confinement layer under conditions of growth carried out in step (e) below;
   c) a third step for the etching, in the second layer, of at least one first aperture ending on the first layer of semiconductor material;
   d) a fourth step of chemical attack, from the said aperture, of the first layer of semiconductor material of the second type, so as to eliminate the same except for a preserved amount to leave at least one seed of semiconductor material of the second type between the second layer and the substrate and so as to form a confinement space;
   e) a fifth step of growth by vapor phase epitaxy initiated by said seed of a monocrystalline semiconductor material of the second type in the confinement space, this growth being done in a first direction of growth.

4. A method according to claim 3, comprising a sixth step for the removal of the confinement layer.

5. A method according to claim 3, wherein the fifth step of growth by vapor phase epitaxy is followed by a step for the etching of at least one second aperture in the second layer, at a position located above the seed, then by a step of chemical attack, through the second aperture, of the seed and of the entire semiconductor part located on either side of the seed and having faults.

6. A method according to claim 5 comprising following after the said steps, a step for the vapor phase epitaxy of a material of the second type through the second aperture.

7. A method according to claim 6, comprising, after the step indicated, a step for the removal of the second layer followed by a step of vapor phase epitaxy of semiconductor material of the second type.

8. A step according to claim 3, wherein the second step is preceded by a step for the etching, in the first layer, of bands constituting interruptions in the first layer, and wherein the band of the first aperture, made during the etching step (c), is not parallel to these bands made in the first layer.

9. A method according to claim 8, wherein the band of the first aperture is perpendicular to the bands made in the first layer.

* * * * *